United States Patent
Barnett

(10) Patent No.: US 10,291,253 B1
(45) Date of Patent: May 14, 2019

(54) PIEZOELECTRIC MAGNETIC DIGITAL TO ANALOG CONVERTER

(71) Applicant: Raul Barnett, Key Biscayne, FL (US)

(72) Inventor: Raul Barnett, Key Biscayne, FL (US)

( * ) Notice: Subject to any disclaimer, the term of this patent is extended or adjusted under 35 U.S.C. 154(b) by 0 days.

(21) Appl. No.: 16/181,623

(22) Filed: Nov. 6, 2018

Related U.S. Application Data

(60) Provisional application No. 62/664,972, filed on May 1, 2018.

(51) Int. Cl.
| | |
|---|---|
| H03M 1/66 | (2006.01) |
| H04R 3/00 | (2006.01) |
| H01L 41/18 | (2006.01) |
| H04R 17/00 | (2006.01) |
| H04R 19/02 | (2006.01) |

(52) U.S. Cl.
CPC ............ *H03M 1/661* (2013.01); *H01L 41/18* (2013.01); *H04R 3/00* (2013.01); *H04R 17/005* (2013.01); *H04R 19/02* (2013.01)

(58) Field of Classification Search
CPC ...... H03M 1/661; H01L 41/18; H04R 29/001; H04R 29/003; H04R 3/00; H04R 17/005; H04R 19/02; H04R 17/00; H04R 11/00; H04R 11/02; G06F 3/0433
USPC .......................................... 341/144; 381/111
See application file for complete search history.

(56) References Cited

U.S. PATENT DOCUMENTS

| | | | | |
|---|---|---|---|---|
| 5,912,978 A | * | 6/1999 | Eastty | H04R 1/005 381/397 |
| 6,321,428 B1 | * | 11/2001 | Toda | B06B 1/0688 29/25.35 |
| 7,091,893 B2 | * | 8/2006 | Seknicka | H03F 3/2175 341/145 |
| 7,573,412 B2 | * | 8/2009 | Kim | H03M 1/80 341/136 |
| 9,276,191 B2 | * | 3/2016 | Ando | G06F 3/0433 |
| 9,986,341 B2 | * | 5/2018 | Miyoshi | H04R 17/005 |
| 2007/0242842 A1 | * | 10/2007 | Kim | H04R 7/045 381/190 |
| 2016/0182993 A1 | * | 6/2016 | Ikeda | H04R 1/1016 381/328 |

* cited by examiner

*Primary Examiner* — Khai M Nguyen
(74) *Attorney, Agent, or Firm* — Richard C. Litman

(57) ABSTRACT

The present invention provides a digital to analog conversion method and system that uses piezoelectric effect and magnetic induction to reconstruct the infinite analog values between discrete digital samples. This magnetic-piezoelectric armature delivers an output analog signal of a smooth continuous nature that provides a more faithful representation of the original analog signal. The method and system use mechanical movement, which is continuous by nature since there is no quantization in the different positions a moving object can assume between two spacial points, to construct the signal approximation between digital samples. The magnetic-piezoelectric armature uses a highly sensitive piezoelectric material that moves a magnet in the proximity of a wire coil to induce a voltage signal reproducing the original analog signal. The piezoelectric material expands and contracts following the changes in voltage between digital samples which induces a corresponding continuous analog voltage signal in the coil.

8 Claims, 7 Drawing Sheets

PIEZOELECTRIC MAGNETIC DIGITAL TO ANALOG CONVERTER

BACKGROUND OF THE INVENTION

1. Field of the Invention

The present invention is related to the field of digital to analog converters, specifically to a new method that uses the inherent analog and continuous nature of physical movement to provide a more accurate reconstruction of the original analog signal.

2. Background of the Related Art

Advances in most technological fields nowadays require more precise reconstruction of analog signals from their digital representations stored in computer memories or digital storage media. Even though our machines and computers process signals in digital format, most digital processes eventually provide an output in analog format to make it possible for the signal to be interpreted by a human being, e.g. audio signals, video signals, tactile pressure signals, to mention a few. The accuracy of how the reconstruction of an analog signal, from its digital form, represents the original analog signal becomes of critical importance as our technologies advance in sensitivity, miniaturization and resolution.

One example of the importance of digital to analog conversion accuracy is found in the resurgence in the past few years of the vinyl record as a medium to store and reproduce audio signals. Even though it has been almost 40 years since the invention of the Compact Disk (CD) digital audio format, it can be stated that some people perceive that there are still some missing sound qualities in the reproduction of digital music when compared with the sound qualities of an analog record.

In a vinyl record, an analog audio signal is stored in a groove that provides a physical guide for a stylus pickup to reconstruct the original signal by moving a magnet close to a coil or a coil close to a fixed magnetic field thus producing a corresponding analog voltage signal. The signal stored in the groove is of a continuous nature since there are no jumps between positions but instead a smooth path of movement connecting all values of the signal. In contrast, a digital audio signal requires a Digital to Analog Converter (DAC) to reconstruct an analog signal from a finite set of digital samples taken from the original signal. The process therefore implies the approximation of all the missing analog values between consecutive digital samples. This problem has been addressed by different methods in prior art, such as sample-estimate-hold reconstruction as presented in U.S. Pat. No. 6,075,475 or linear approximation between samples as presented in U.S. Pat. No. 5,268,688.

SUMMARY OF THE INVENTION

A digital to analog conversion process involves the reconstruction of an analog signal comprised of infinite values from a finite set of discrete samples stored in digital format. Therefore, a critical stage of the digital to analog conversion process requires the interpolation and the reconstruction of the infinite analog signal values between digital samples.

The present invention provides a new method to solve the problem of reconstructing analog values between digital samples by leveraging the continuous nature of mechanical movement as a mechanism to ensure a faithful reproduction of a continuous nature of the original analog signal. The method uses voltage variation between consecutive samples to drive a highly sensitive piezoelectric material. A magnet or coil attached to the piezoelectric material moves along with it, magnetically inducing a continuous analog signal that represents the values between digital samples.

In this new method, the digital samples are first converted into an analog staircase approximation using a conventional DAC. This staircase signal is then used to drive a piezoelectric material. The changes in voltage (or current) between consecutive samples will expand or contract the piezoelectric material which will magnetically induce corresponding voltage signals in a coil. The movement of said piezoelectric material will generate infinite analog values of a continuous nature that accurately reconstruct the missing analog values between digital samples.

New advancements in piezoelectric materials, such as polyvinylidene fluoride (PVDF), which presents extraordinarily large piezoelectric coefficients in a flexible and lightweight material, provides the perfect piezoelectric for the implementation of the current invention. This PVDF piezoelectric option in conjunction with available miniaturization technologies for the magnet and coil assembly makes it possible to implement the current invention as a highly accurate DAC in a very small physical footprint.

The present invention provides a digital to analog conversion method for any application that requires a highly accurate reproduction of an analog signal. These applications can be, but are not limited to, high definition audio signals for music or speech reproduction, the transmission of digital signals in telecommunications networks, analog signals for robotic applications such as the control of highly sensitive electric motors or actuators and neurological devices or transducers that require the reproduction of analog signals of very low voltage (current) levels with complex wave forms, among others.

DETAILED DESCRIPTION OF THE INVENTION

The present invention focuses on a new method to reconstruct the output analog signal at the output stage of a Digital to Analog converter in the most accurate possible way, reflecting a truthful representation of the original analog signal.

This new method will use the inherent continuousness of the physical movement of an object between different spacial points as a mechanism to represent the continuous variations of an electrical signal. The concept behind this method is that an object that moves or oscillates between points A and B will not suffer from any quantization in the different positions in the movement path but instead its position will change continuously and smoothly from point to point. In other words, there is no quantization in the different physical positions and object can assume between two spacial points A and B. This idea is applied to a magnet as it moves or oscillates following the expansions and contractions of a piezoelectric material responding to changes in the voltage applied to it. In the current invention, the different voltage levels between consecutive digital samples will produce either an expansion or a contraction of the piezoelectric material. In one embodiment of the invention, this movement will be translated in the movement of a magnet in the proximity of a coil. This action will induce a voltage in the coil. This induced voltage will vary continuously and smoothly between digital samples, therefore interpolating a true analog signal between digital samples without using filters or any other mechanism to approximate the missing values between consecutive digital samples. The end result is a naturally formed analog signal that flows smoothly from digital sample to digital sample.

Figure 1A:
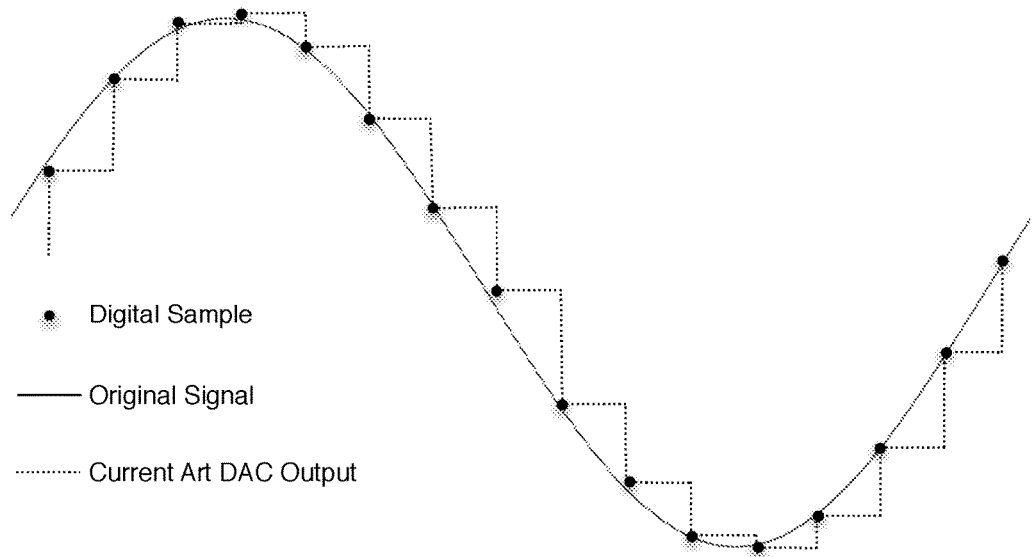
FIG. 1A depicts a prior art staircase reconstruction of an analog signal from digital samples.
Figure 1B:
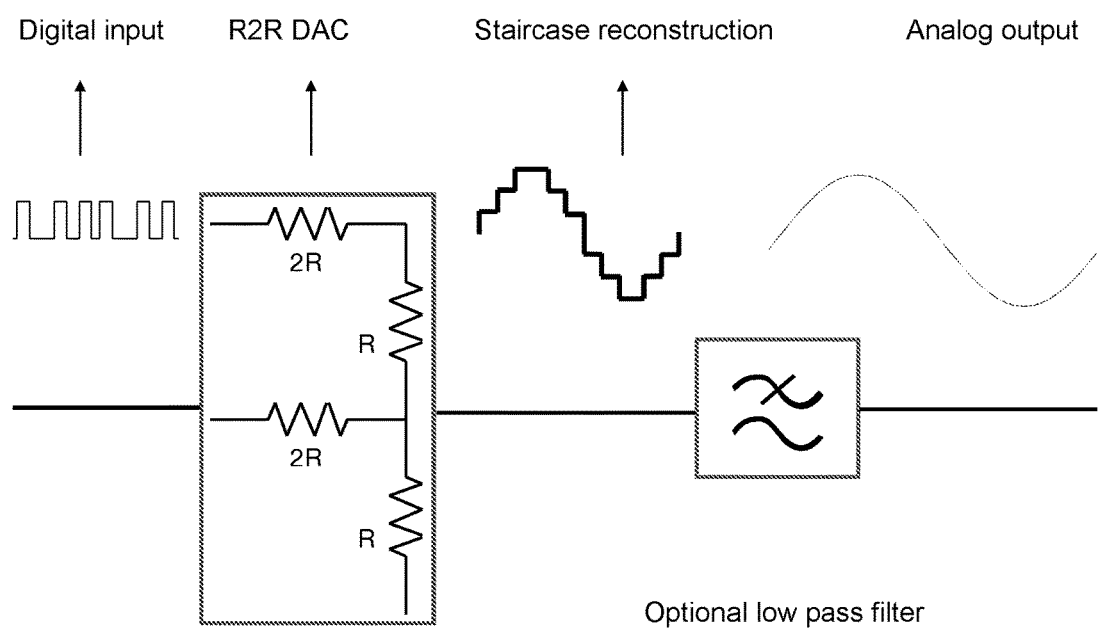
FIG. 1B. depicts a common output stage of prior art, in which a staircase approximation is passed through a low pass filter in order to obtain a continuous and smooth analog signal.
Figure 2A:
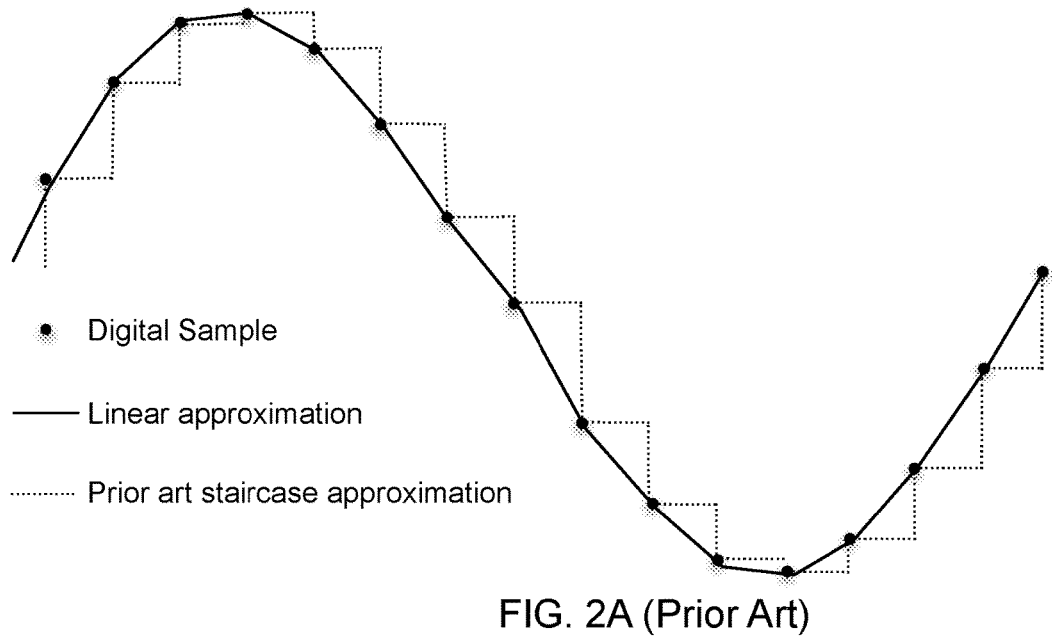
FIG. 2A depicts one example of a prior art approach to improve the interpolation between samples by means of statistical values calculated from the history of the signal.
Figure 2B:
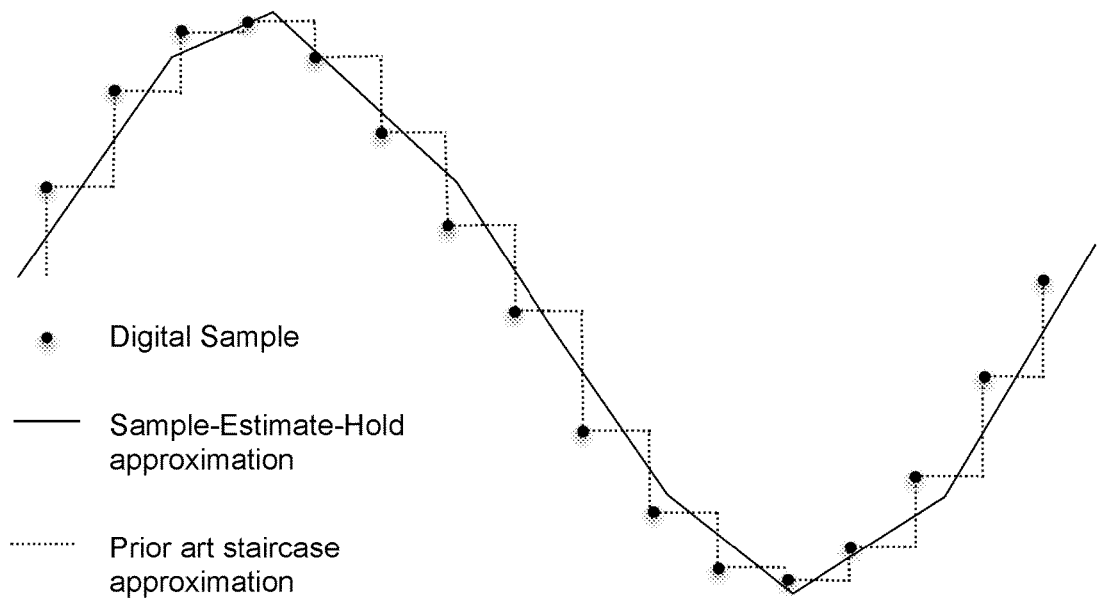
FIG. 2B depicts one example of a prior art approach to improve the interpolation between samples by linear approximation.
Figure 3:
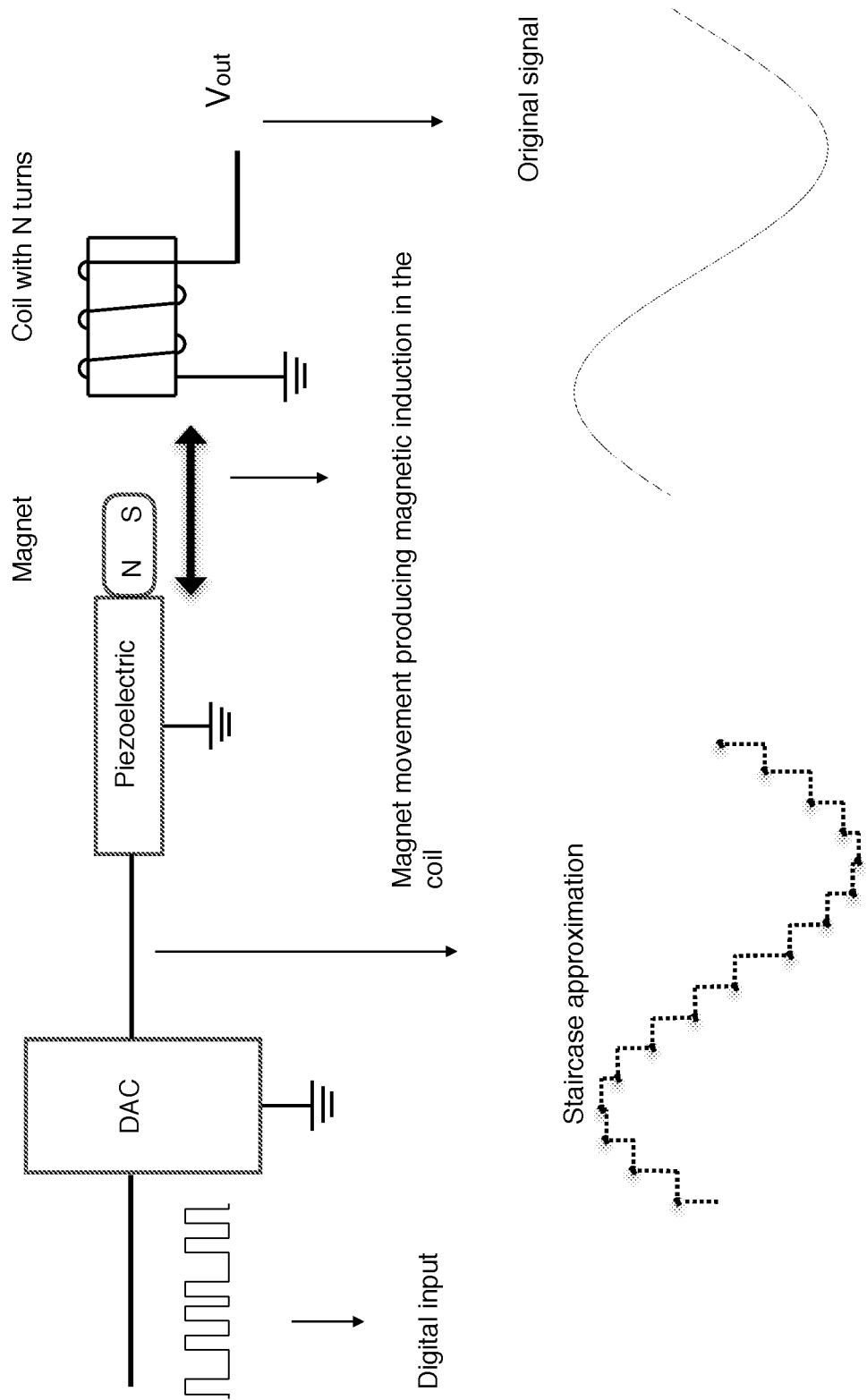
FIG. 3 shows a schematic view of the current invention with the main elements comprising the magnetic-piezoelectric armature to generate the output analog signal stage.

FIG. 3 shows a schematic view of the implementation of the magnetic-piezoelectric armature to generate the output analog signal stage. In this embodiment of the invention a highly sensitive piezoelectric material, such as a PVDFN film, is used to generate precision physical movement following the variations in voltage between digital samples. A strong but lightweight permanent magnet is attached to one end of the piezoelectric film in a way that it will move following the expansions or contractions of the piezoelectric material. In proximity of the magnet there is a coil of N turns with and inductance L. The movement of the magnet will induce a voltage signal in the open ends of the coil.

Figure 6:
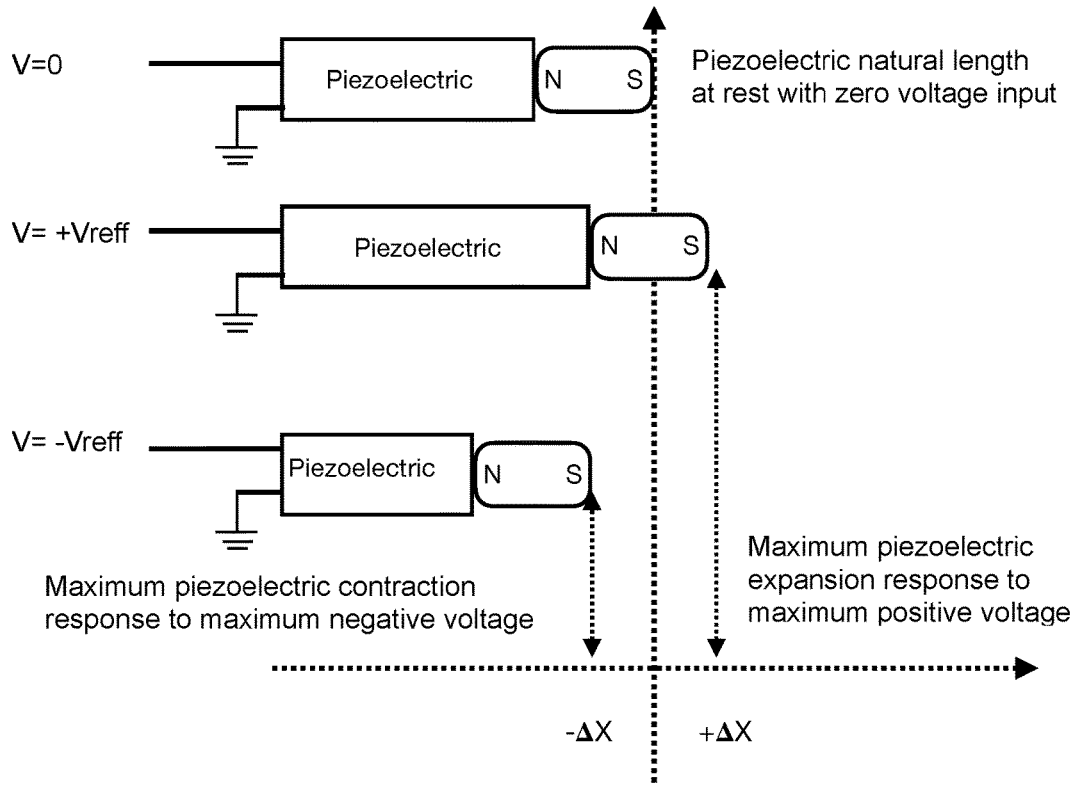
FIG. 6 shows the movement range of the piezoelectric-magnetic armature based on the maximum and minimum voltages possible at the DAC staircase output stage.

The piezoelectric material will have a range of movement and it will expand or contract from its resting position depending on the voltage level applied to its terminals. Therefore, with a zero volts input the piezoelectric-magnetic armature will not experience any movement, with a maximum positive voltage the armature will move to its farthest positive voltage position and with a maximum negative voltage the armature will contract to its lowest voltage position, as presented in FIG. 6. Let's consider the maximum and minimum possible voltages represented by the digital samples to be +Vreff and −Vreff. Since the light weight magnet is attached to one end of the piezoelectric material, the magnet will be able to move between the maximum and minimum voltage positions thus inducing the corresponding values as an analog output signal. For the purposes of the current disclosure, only one dimensional movement (straight line) will be considered for inducing voltage signals in the coil. It is understood that piezoelectric materials usually expand and contract in three dimensions and these additional movement dimensions could be used to assist in the reconstruction of analog output stages in future embodiments of the current invention.

Figure 7:
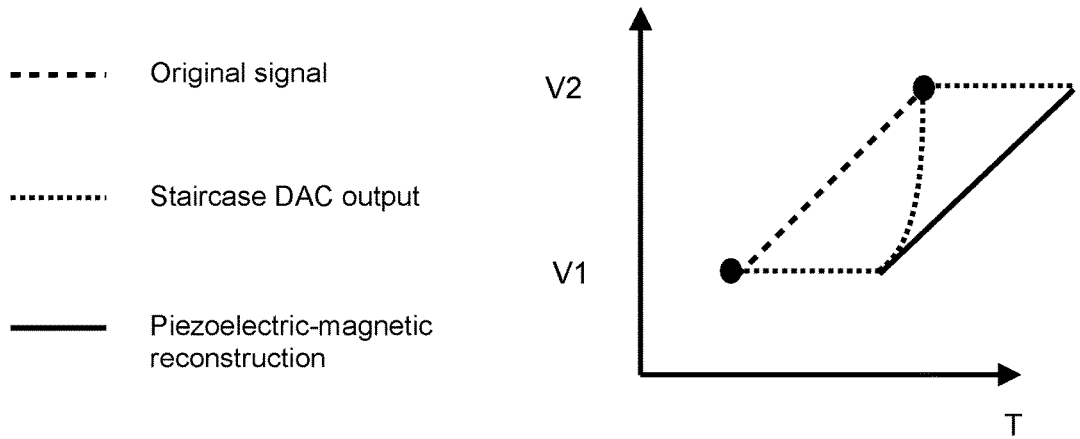
FIG. 7 Details the time delay between the staircase reconstruction stage and the final piezoelectric-magnetic final reconstruction stage between two consecutive samples.

Let's consider the case of two consecutive digital samples S1 and S2, representing voltages V1 and V2 where V1<V2. As the DAC changes its output voltage through its transition curve, as depicted in FIG. 7, the increasing voltage applied to the piezoelectric input will linearly expand the material causing the attached magnet in FIG. 3 to induce an increasing voltage output at the terminals of the coil in FIG. 3. Similarly, for the case where V1>V2 the reduction in voltage between samples will cause a contraction of the piezoelectric material and subsequent retraction of the magnet movement which will in turn reduce the induced voltage at the coil terminals.

Figure 8:
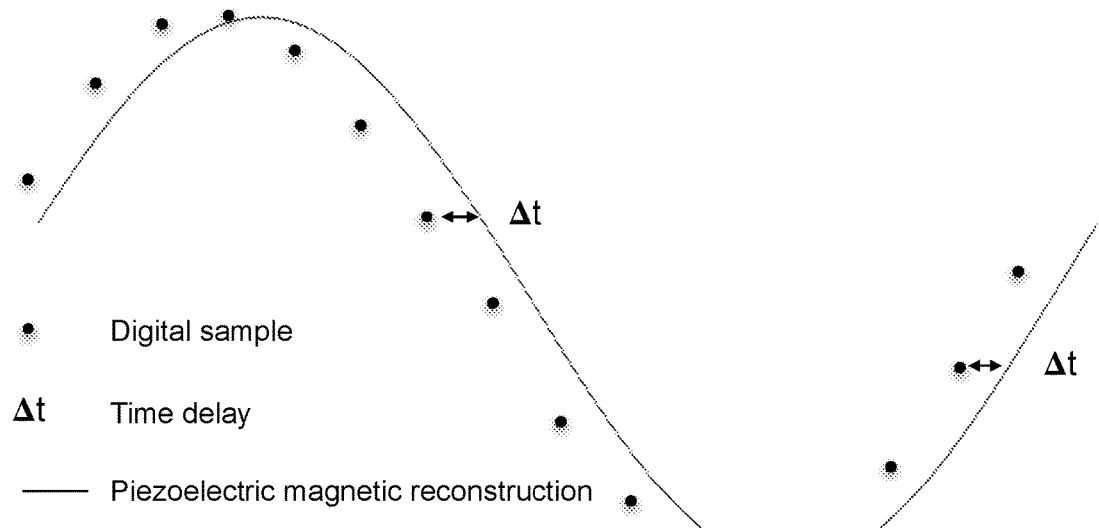
FIG. 8 shows a constant time delay between the processing of the digital samples and the final production of the analog output through the piezoelectric-magnetic stage.

The resulting signal produced by the piezoelectric magnetic's output stage between two consecutive digital samples will present a delay as the piezoelectric material expands or contract following the voltage change between the samples. this delay will be constant for all samples due to the linearity of the selected piezoelectric material. In this manner, the whole analog output signal will be reconstructed with a delta t delay from the original lecture (processing) time of the digital samples as depicted in FIG. 8.

Another consideration for the implementation of the current invention has to do with the voltage level of the magnetically induced output signal and its relationship with the voltage level represented by the digital samples. In order to achieve the output analog signal to reproduce the original levels of the sampled signal, the inductance of the coil depicted in FIG. 3 must be such that when the maximum voltage level of the digital sample is fed to the piezoelectric material the same maximum voltage is induced in the coil. This calibration can be achieved by changing the coil's inductance (by changing the number of turns N in the coil) to match the particular magnet displacement characteristics due to the particular piezoelectric material chosen for the piezoelectric-magnetic armature.

Figure 4:
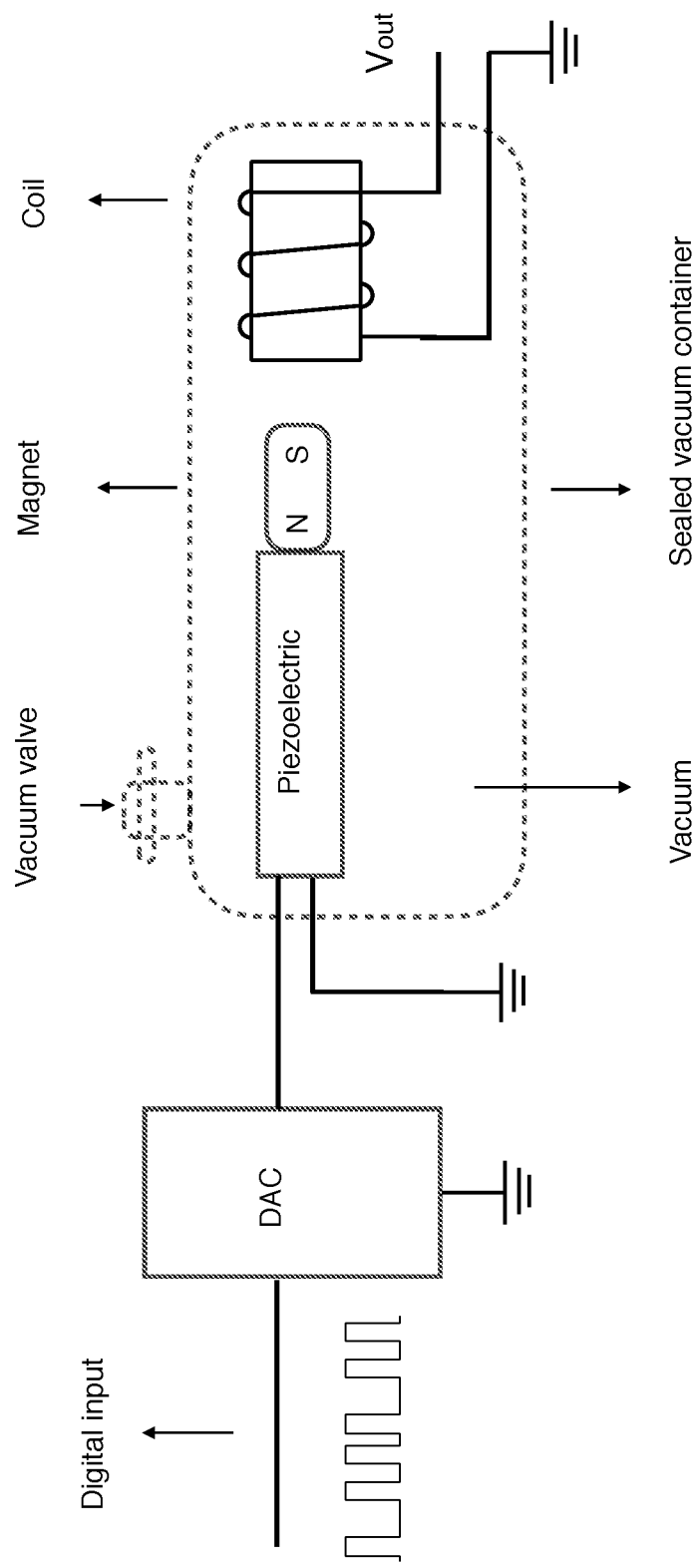
FIG. 4 shows another embodiment of the present invention where the piezoelectric-magnetic armature is embedded in a container with a vacuum index n.

FIG. 4 shows another embodiment of the present invention where the piezoelectric-magnetic armature is embedded in a vacuum sealed container. A vacuum is generated inside the container with the objective of avoiding sound waves to be transmitted from the piezoelectric-magnet armature to the DAC system. Another objective of this embodiment is to avoid a potential resonance frequency in the DAC enclosure to interfere with the reconstruction of the output analog signal. One implementation of this embodiment of the invention could be achieved by using vacuum bulb technology similar to that found on incandescent light bulbs or vacuum tubes where a small piezoelectric-magnetic armature would be inserted into a glass tube which would then be connected to a vacuum machine to generate a vacuum inside the tube and then sealing the tube while leaving the armature connector terminals (two input and two output) outside the sealed tube.

Figure 5:
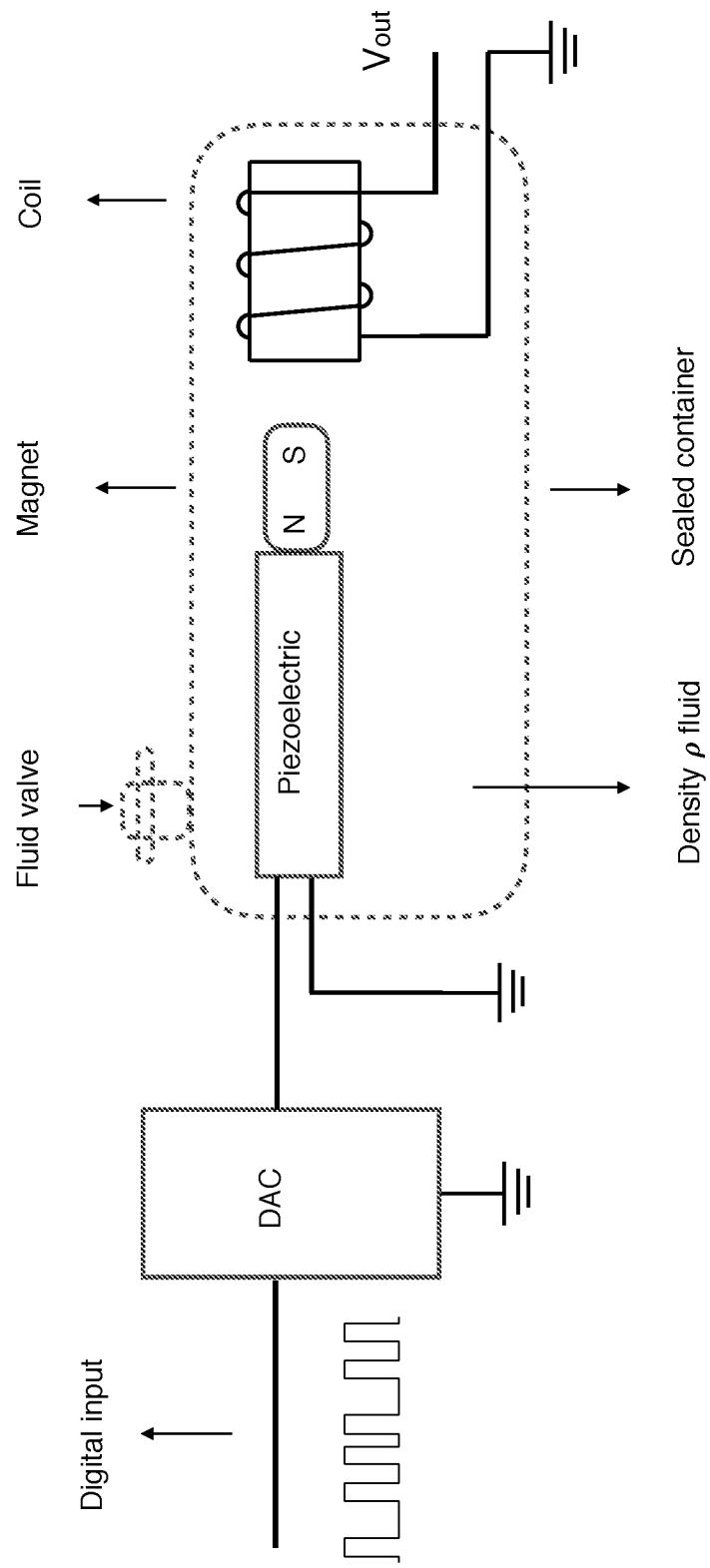
FIG. 5 shows another embodiment of the present invention where the piezoelectric-magnetic armature is embedded in a container filled with a fluid with a density p.

FIG. 5 shows another embodiment of the present invention where the piezoelectric-magnetic armature is embedded in a container filled with a fluid with a density $\rho$. For certain DAC applications the fluid could be used to shape the frequency response of the piezoelectric-magnetic armature in such a way to limit certain frequencies or to obtain a desired decay in the piezoelectric response. By changing the fluid's density $\rho$, different frequency response bandwidths could be achieve in the DAC as the friction index between the piezoelectric-magnet armature and the fluid changes. A piezoelectric material has a natural bandwidth response range based on its molecular structure and construction dimensions. A piezoelectric material could be engineered to have a desired frequency response and bandwidth depending on the type of application the DAC is intended for. The addition of a fluid surrounding the piezoelectric-magnetic armature provides an additional mechanism to shape the frequency response of a particular piezoelectric-magnetic armature and to fine tune its response for particular DAC applications.

The invention claimed is:

1. A digital to analog converter (DAC) signal processing system, comprising:
   a pre-conversion stage to receive an input signal in a digital format, wherein the digital signal comprises discrete digital samples with discrete voltage levels between consecutive digital samples, further wherein a DAC receives the digital samples and converts them to an analog approximation staircase signal;
   a conversion stage in electrical communication with the pre-conversion stage and operable to convert the analog approximation staircase signal to a reconstructed continuous analog signal, the conversion stage consists of a magnetic-piezoelectric armature including:
   i) a piezoelectric material adapted to generate physical movement following the variations in voltage between the digital samples;
   ii) a magnet attached to the piezoelectric material and adapted to move therewith; and
   iii) a coil having a plurality of turns and adapted to have an induced voltage signal produced, wherein the number of turns is selected to match the magnet displacement characteristics due to the particular piezoelectric material chosen; and
   an output stage operable to output the reconstructed analog signal.

2. The digital to analog converter (DAC) signal processing system according to claim 1, wherein the magnetic-piezoelectric armature is enclosed in an adjustable pressurized container whose pressure is adjustable from a vacuum level to above atmospheric pressure level.

3. The digital to analog converter (DAC) signal processing system according to claim 1, wherein the magnetic-piezoelectric armature is enclosed in a sealed container filled with a fluid having a predetermined density.

4. The digital to analog converter (DAC) signal processing system according to claim 1, wherein the piezoelectric material is a polyvinylidene fluoride (PVDF) film.

5. The digital to analog converter (DAC) signal processing system according to claim 1, wherein the input signal is an audio signal.

6. The digital to analog converter (DAC) signal processing system according to claim 5, wherein the audio signal is music.

7. The digital to analog converter (DAC) signal processing system according to claim 5, wherein the audio signal is voice.

8. A digital to analog converter (DAC) signal processing method, comprising the steps of:
   providing a digital to analog converter (DAC) signal processing system, the system comprising:
      a pre-conversion stage to receive an input signal in a digital format, wherein the digital signal comprises discrete digital samples with discrete voltage levels between consecutive digital samples, further wherein the DAC receives the digital samples and converts them to an analog approximation staircase signal;
      a conversion stage in electrical communication with the pre-conversion stage and operable to convert the analog approximation staircase signal to a reconstructed continuous analog signal, the conversion stage consists of a magnetic-piezoelectric armature including:
      i) a piezoelectric material adapted to generate physical movement following the variations in voltage between the digital samples;
      ii) a magnet attached to the piezoelectric material and adapted to move therewith; and
      iii) a coil having a plurality of turns and adapted to have an induced voltage signal produced, wherein the number of turns is selected to match the magnet displacement characteristics due to the particular piezoelectric material chosen; and
      an output stage operable to output the reconstructed analog signal;
   providing a source of digital signals that are a recorded version of corresponding analog signals, wherein the digital signals constitute consecutive digital samples;
   sending the digital samples to the pre-conversion stage, wherein the DAC receives the digital samples and converts them to an analog approximation staircase signal;
   outputting the analog approximation staircase signal to the conversion stage and converting the analog approximation staircase signal to a reconstructed continuous analog signal via the magnetic-piezoelectric armature; and
   outputting the reconstructed continuous analog signal.

* * * * *